United States Patent [19]

Schreiber et al.

[11] Patent Number: 5,158,466
[45] Date of Patent: Oct. 27, 1992

[54] METALLICALLY ENCAPSULATED ELEVATED INTERCONNECTION FEATURE

[75] Inventors: Christopher M. Schreiber, Newport Beach; David B. Swarbrick, El Toro; Haim Feigenbaum, Irvine, all of Calif.

[73] Assignee: Hughes Aircraft Company, Los Angeles, Calif.

[21] Appl. No.: 663,972

[22] Filed: Mar. 4, 1991

[51] Int. Cl.⁵ .............................................. H01R 9/09
[52] U.S. Cl. ..................................... 439/67; 29/846; 439/86
[58] Field of Search ............... 439/55, 66, 67, 74, 439/77, 86, 91; 29/832, 846, 848, 884; 361/398, 406

[56] References Cited

U.S. PATENT DOCUMENTS

| | | | |
|---|---|---|---|
| 3,680,206 | 8/1972 | Roberts | 29/846 |
| 3,936,930 | 2/1976 | Stern | 361/412 |
| 3,971,610 | 7/1976 | Buchoff et al. | 174/261 |
| 4,000,054 | 12/1976 | Marcantonio | 29/846 |
| 4,116,517 | 9/1978 | Selvin | 439/67 |
| 4,403,272 | 9/1983 | Larson et al. | 439/67 |
| 4,758,459 | 7/1988 | Mehta | 264/104 |
| 4,813,129 | 3/1989 | Karnezos | 439/74 |

OTHER PUBLICATIONS

IBM Bulletin, Ward, vol. 18, No. 9, p. 2817, Feb. 1976.

*Primary Examiner*—Neil Abrams
*Attorney, Agent, or Firm*—Jeannette M. Walder; Terje Gudmestad; Wanda K. Denson-Low

[57] ABSTRACT

A pressure type contact (10) for flexible or conventional wire cable terminations is fabricated from electroformed thin metallic wafers in which one wafer is plated with a raised conductive interconnection feature. The raised feature is formed by placing a small lump (44) of electrically conductive resin on a substrate (12) and then electrolytically forming on the substrate a trace (18) having an enlarged connector pad (20) that completely covers the cured projecting resin lump.

6 Claims, 2 Drawing Sheets

METALLICALLY ENCAPSULATED ELEVATED INTERCONNECTION FEATURE

BACKGROUND OF THE INVENTION

1. Field of the Invention

The present invention relates to manufacture of electrical circuitry and more particularly concerns manufacture of electrical circuitry incorporating an elevated interconnection feature having a three dimensional configuration including a contact that extends from the plane of the circuit.

2. Description of Related Art

Both flexible and rigid printed circuits are connected to similar circuits and other components by means of various types of connecting devices. Flat, flexible printed circuit connecting cables warrant use of similarly configured connecting devices and have been developed to a point where connection between one such printed circuit cable and another is made by providing a plurality of projecting metallic interconnection features that may be pressed against either similar features or mating metallic connecting pads on the other circuit component or components. Flexible circuit terminations or connecting wafers of this type are described in U.S. Pat. No. 4,125,310 to Patrick A. Reardon, II, U.S. Pat. No. 4,116,517 to Selvin, et al, and U.S. Pat. No. 4,453,795 to Moulin, et al. The connectors of these patents embody a substrate having traces chemically milled thereon with a plurality of metallic raised features later formed to project from the plane of the circuit conductors. Thus, when two such connectors are placed face to face with the raised features of one in registration and contact with the other, the planes of the etched electrical circuits are suitably spaced from one another because of the projection features. The two circuits may be physically clamped together to press the features against one another, thereby making firm electrical contact between the two circuits. These terminations are effective and reliable in operation but difficult, costly and time consuming to manufacture. Major problems in manufacture of such connectors derive from the fact that the projecting contact buttons must be fabricated separately from (either after or before) the fabrication of the circuitry itself. This creates difficult registration problems between the circuit, the areas where the holes are to be drilled and contact buttons to be placed and the circuit art work (optical mask) that may need to be positioned on either side of the dielectric core.

Where raised interconnection features are employed, as in flexible circuit termination wafers, it is necessary also to plate projecting contact features on pads formed in the circuitry which has been previously etched. These features must be precisely registered with the selected pads and with the datum of the panel. However, the panels have been previously processed to form the circuit traces so that further stresses occurring in such processing effect changes in dimension which cause severe registration problems.

In some cases the projecting interconnection features or dots may be formed first, before the remainder of the etched circuit is formed, but in any event the feature must be formed separately at a different time than the time of forming the etched circuitry, and thus registration problems are magnified.

Conventional etched circuit processes in general have a number of disadvantages. Dimensional precision is difficult to achieve. The use of various etching, stripping and cleaning fluids requires special handling of hazardous chemicals. Techniques for disposal of the resulting effluents are complex, expensive and subject to strict government controls. Etched circuit processing has a relatively low yield, greatly increasing the cost of the processing, which inherently involves a large number of costly processing steps.

In a co-pending application, Ser. No. 580,758, filed Sep. 11, 1990, of William R. Crumly, Christopher M. Schreiber and Haim Feigenbaum, for Three Dimensional Electroformed Circuitry, assigned to the assignee of the present application, there is described a method of forming elevated contact features by electroforming or additive processes which avoid and substantially eliminate sequential etching and plating processes.

In the processes of the prior application for Three Dimensional Electroformed Circuitry, an electrically conductive mandrel, having three dimensional features formed thereon, is electroplated in a selected pattern to additively form the circuitry together with its three dimensional contact and interconnection features directly therein. This process requires a specially formed and prepared mandrel which introduces additional steps and complexity into the process.

Accordingly, it is an object of the present invention to provide methods and apparatus for manufacture of electrical three dimensional circuitry which avoid or minimize above mentioned problems and which eliminate sequential etching and plating processes employed in the formation of three dimensional circuitry.

SUMMARY OF THE INVENTION

In carrying out principles of the present invention, in accordance with a preferred embodiment thereof, a small lump of electrically conductive material is deposited on a substrate and then encapsulated with an electrically conductive connector pad which is itself connected to a conductive lead on the substrate. In a specific embodiment a small amount of an electrically conductive resin is placed on the substrate at the connector pad locations, and then the electrically conductive leads, together with the enlarged connector pads at their end portions, are electroformed directly upon the substrate with the pad end portions of the leads completely covering the raised lump of conductive material to thereby form an elevated connector pad.

DESCRIPTION OF THE PREFERRED EMBODIMENTS

The methods and apparatus described herein provide alternate methods and apparatus to the arrangements shown and described in the above-identified co-pending application for Three Dimensional Electroformed Circuitry and may employ the additive electroforming processes described therein. Accordingly, the disclosure of such co-pending application is incorporated herein by this reference as though fully set forth. The present methods and apparatus, like the methods of the above-identified patent application, enable manufacture of three dimensional electrical circuitry having circuit components lying in a single plane which is generally, but not necessarily, a planar surface, and which circuitry also has three dimensional features projecting from the surface. Importantly, the projecting features and the circuitry are all formed by additive processes, such as electrolytic plating, electroless plating, electrophoretic or electrostatic coating, or other forms of electroforming or electrodeposition of conductive material. No etching is employed in the manufacture of the circuit and connections, making it an environmentally safe process. However, unlike the methods and apparatus of the above-identified patent application for Three Dimensional Electroformed Circuitry, the invention described herein can be practiced without use of any mandrel.

Figure 1:
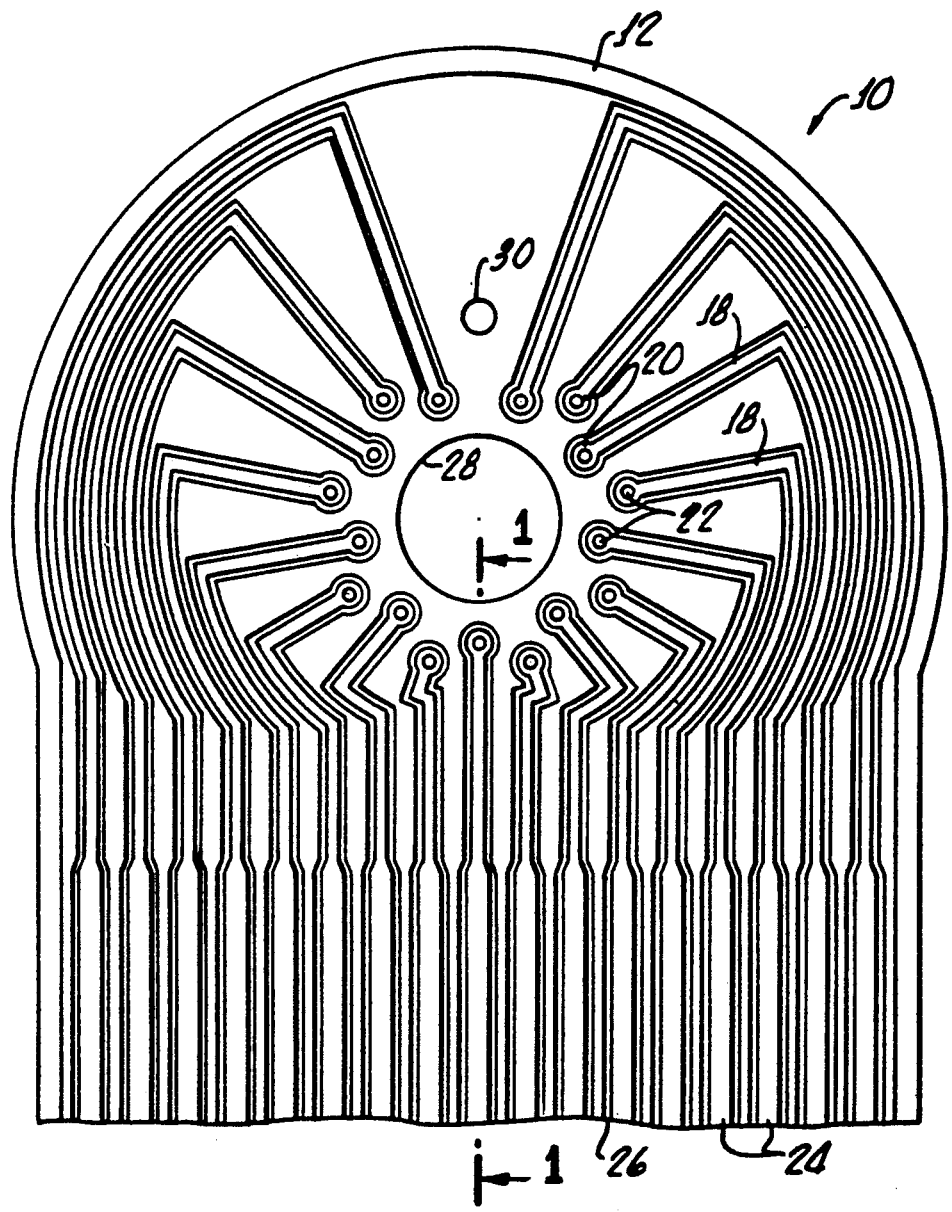
FIG. 1 illustrates one part of a typical wafer connector.
Figure 2:
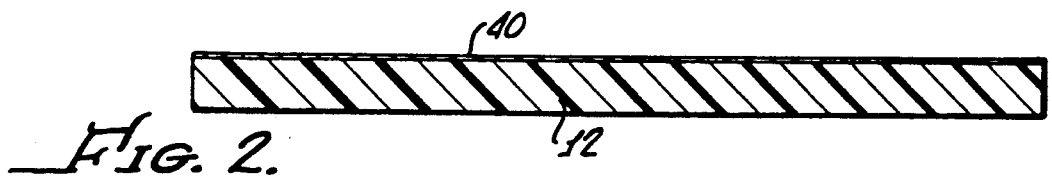
FIGS. 2 through 7 show cross sections of a circuit connector part in various stages of manufacture.

Processes described herein have been initially adapted to the manufacture of flexible cable terminations of the type illustrated in the above-identified patents to Moulin, et al and Reardon, where a group of contact buttons (raised features) is formed at the ends of conductive leads on a connection wafer for purposes of making circuit to circuit connections. Thus, as shown in FIG. 1 herein, and as more particularly illustrated and described in U.S. Pat. No. 4,453,795 to Moulin, et al, an exemplary connector wafer 10 comprises a layer or sheet of a dielectric substrate material, such as polyimide 12, having a pattern of electrically conductive traces (leads) or connector pads 18 terminating in contact pads 20. Additionally, on one of a pair of connector wafers (only one of which is shown in FIG. 1) are formed metallic buttons (raised features) 22. The other ends 24 of conductive connector pads 18 extend to a common edge 26 for attachment to a flexible cable or conventional wire cable such as by surface lap soldering. Preferably a central hole 28 and an alignment hole 30 are placed through each wafer so as not only to obtain connection between a pair of wafers of the type shown in FIG. 1, but also to mutually align the respective contact pads 20 on each of the wafers.

As more particularly described in the above-identified U.S. Pat. No. 4,453,795, the wafer and its contact buttons 20 will be pressed against a similar wafer and contact buttons or against another electrical circuit to provide a readily connectable and disconnectable electrical interconnection of the pads of the two terminating wafers or circuits.

FIGS. 2 through 7 show, in cross section, successive steps in the manufacture of a single one of the traces 18 including its raised pad 20 and raised feature 22. In accordance with the manufacturing techniques described herein, the raised feature and pad are basically the same element, with the raised feature being provided simply by an elevated central portion of the pad itself. The drawings of FIGS. 2 through 7 may be considered as showing steps in the manufacture of one of the traces as would be seen on the section indicated at A—A of FIG. 1.

Figure 3:
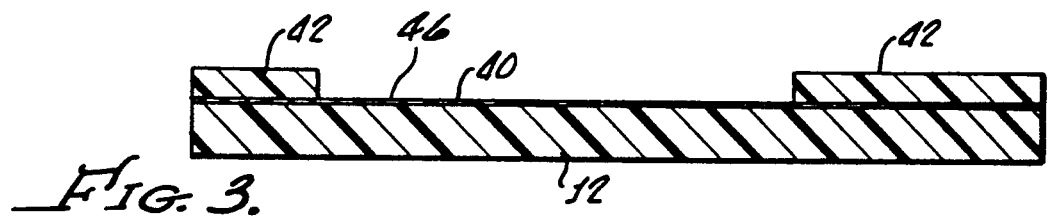
Figure 4:
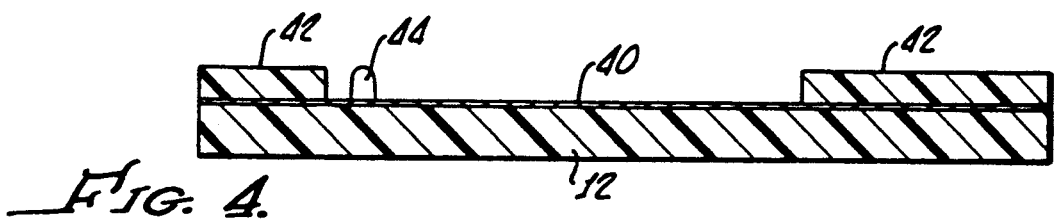

Initially the substrate 12, which is a suitable dielectric material of any one of many well known types commonly used in printed circuitry, is caused to have its upper surface coated with an electrically conductive material. Thus, as an example, a suitable metal coating 40 of about 2,000 angstroms in thickness, such as molybdenum, chrome, nickel, copper, or any combination or alloy thereof 40 is formed on a surface of substrate 12 by conventional sputtering techniques. Thereafter, as illustrated in FIG. 4, a pattern of resist 42 is deposited on the electrically conductive surface 40 of the substrate, employing conventional masking techniques. Thereafter, as indicated in FIG. 3, a small lump or dollop 44 is deposited on areas 46 of the substrate at which are to be formed the contact buttons or elevated features. Each lump 44 is preferably formed of a solid, relatively high strength material such as a suitable resin laden with an electrically conductive or metallic powder and cured in place so as to bond to the substrate. Conductive resins such as silver epoxy, gold epoxy or aluminum epoxy may be used. Other electrically conductive materials may be employed, but epoxy is presently preferred because the contacts may be subjected to relatively high compressive stresses. Solder is not desirable for the lump because of the requirement that it be used with a solder flux. In this process the flux could not be removed so that its adverse affects on the circuit would remain. The conductive lump has an area smaller than the area of the conductive pad 20 that is to be formed and has a height substantially equal to the thickness of the trace that is to be formed on the substrate. The lumps may be dispensed in the desired pattern of pads as drops of a liquid resin of suitable viscosity, or may be applied by silk screening or by mask and spray techniques.

Figure 5:
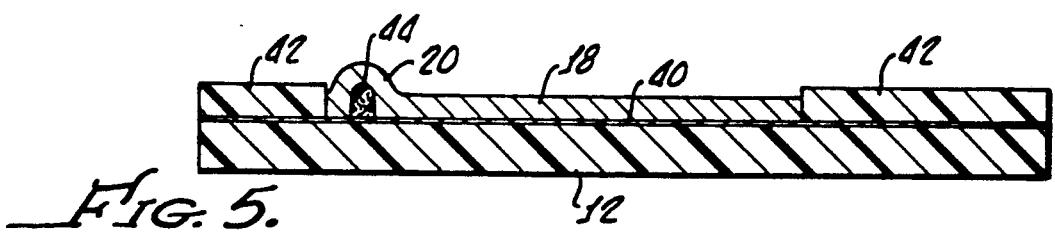

The conductive resin lump is cured in place and the substrate is then emersed in an electrolytic bath wherein traces 18, together with conductive contact pads 20, are integrally formed on the substrate, as shown in FIG. 5. The thin coating 40, having a thickness of approximately 2,000 angstroms for example, makes the dielectric substrate conductive so as to accept the electrolytic plating of traces 18, which may be of copper or other suitable trace material. The resist 42 limits and defines areas of application of the electrolytically plated traces and pads and is stripped from the substrate after electrodepositing the traces, as shown in FIG. 6.

Figure 6:
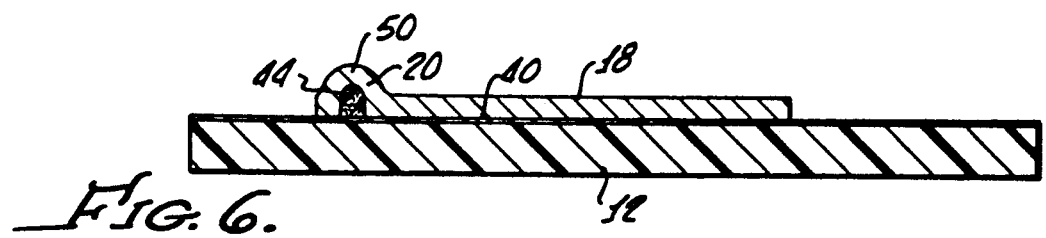
Figure 7:
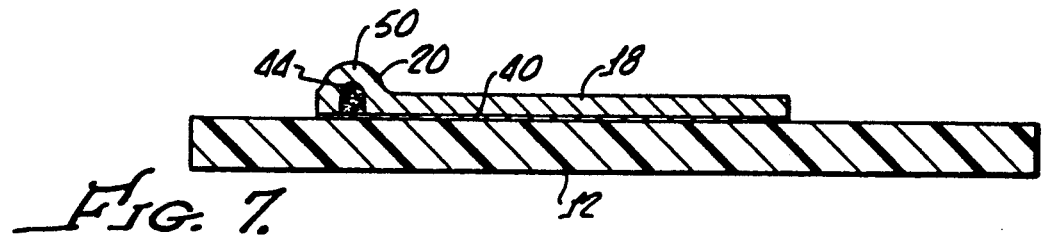

In the stage shown in FIG. 6, the substrate, still covered with the sputtered on metallic coating, has its electrolytically deposited traces 18 together with the integral connector pad 20 formed thereon. During the electrolytic plating, the plated material is deposited on and adheres to the electrically conductive lump 44, thereby effectively completely encapsulating the lump. Thus the integral connecting pad 20 has outer peripheral portions adjoining trace 18 at an elevation which is the same as the elevation of the surface of the main body of the trace 18 but has a central portion, such as its central portion 50, which is elevated above the surface of the trace because of the elevation of the encapsulated conductive epoxy lump 44.

Now, as a final step, the sputtered on metal coating 40 is removed from those areas not covered by traces and pads 18,20, and the traces, together with the raised contact features, are completed.

Although electrolytic plating is presently preferred for formation of the traces and pads, it is contemplated that any one of several well known types of additive electroforming may be employed for the formation of the trace 18 and its pad 20. Thus no conventional etching processes with all the inherent disadvantages thereof need be employed. The raised feature is made not only without several successive and separate plating processes, but also without the use of any mandrel. After having deposited the small amount of electrically conductive resin, the entire trace and its raised conductive pad are then formed in a single electroforming step, with the contact pad being fully integral with the trace.

The raised integral contact pad, being of one piece, is more reliable and less subject to lack of adhesion between two different parts of the raised feature.

In an alternate embodiment (not illustrated) the resin dollops 44 may be applied to the substrate before the latter is covered with its sputtered on conductive coating 40 so that the coating also covers the resin dollop. The traces and pads are then plated directly on to the coating 40 with the pad 20 having an elevated portion covering the coating 40 that covers the resin. In this arrangement, because the resin dollop is covered by an electrically conducive coating, the resin itself need not be electrically conductive.

As still another alternate embodiment the dielectric substrate may be molded, as by conventional vacuum, compression or injection molding techniques, with a selected pattern of lumps formed integrally with the substrate, so that the subsequently applied sputtered on thin coating 40 will cover all areas, including the integral lumps, on which the traces and pads are to be electrodeposited.

What is claimed is:

1. A method of forming an electrical connector part comprising the steps of:
   providing a flexible substrate;
   coating the substrate with a thin electrically conductive material;
   forming a raised lump of solid, relatively high strength non-elastomeric material on the coated substrate;
   wherein the lump comprises a resin laden with an electrically conductive material cured in place on the thin coating of the substrate;
   encapsulating the lump with an electrically conductive connector pad on the substrate; and
   forming an electrically conductive trace on the substrate in electrical connection with the pad.

2. The method of claim 1 wherein the resin is selected from the group consisting of silver epoxy, gold epoxy and aluminum epoxy.

3. The method of claim 1 wherein the step of encapsulating comprises electroforming the pad over the lump and on at least part of the substrate adjacent the lump.

4. The method of claim 1 wherein the steps of encapsulating and forming comprise electroforming on the substrate a conductive trace having a partially raised integral pad covering the lump.

5. An electrical connector part comprising:
   a flexible substrate, wherein the substrate comprises a dielectric material having a thin electrically conductive coating;
   a raised lump of solid, relatively high strength, non-elastomeric material formed on the substrate, wherein the lump comprises a resin laden with an electrically conductive material and cured in place on the thin coating of the substrate;
   an electrically conductive connector pad encapsulating the lump and formed on the substrate; and
   an electrically conductive trace formed on the substrate in electrical connection with the pad, wherein the trace and pad are electroformed on the thin coating and on the lump.

6. The connector of claim 5 wherein the resin is selected from the group consisting of silver epoxy, gold epoxy and aluminum epoxy.

* * * * *